(12) United States Patent
Iwabuchi (10) Patent No.: US 8,410,961 B2
(45) Date of Patent: Apr. 2, 2013

(54) SEMICONDUCTOR INTEGRATED CIRCUIT

(75) Inventor: Masaru Iwabuchi, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 70 days.

(21) Appl. No.: 13/188,459

(22) Filed: Jul. 21, 2011

(65) Prior Publication Data
US 2012/0019969 A1 Jan. 26, 2012

(30) Foreign Application Priority Data
Jul. 26, 2010 (JP) ................................. 2010-167274

(51) Int. Cl.
H03M 1/00 (2006.01)
(52) U.S. Cl. ...................... 341/122; 341/155
(58) Field of Classification Search .................. 341/122, 341/155, 120, 141, 172, 154, 159, 153
See application file for complete search history.

(56) References Cited

U.S. PATENT DOCUMENTS
7,277,038 B2  10/2007  Yada et al.
8,018,362 B2 *  9/2011  Katsuki et al. ................ 341/122

FOREIGN PATENT DOCUMENTS
JP  11-154864 A  6/1999
JP  2005-26805  1/2005

* cited by examiner

Primary Examiner — Joseph Lauture
(74) Attorney, Agent, or Firm — Miles & Stockbridge P.C.

(57) ABSTRACT

In combining an analog terminal of an A/D converter with a digital terminal, the effect of the noise from the digital terminal is reduced. A semiconductor integrated circuit includes a high-speed external terminal, a low-speed external terminal, a high-speed analog switch, a low-speed analog switch, and an A/D converter. The high-speed external terminal is coupled to an input of the A/D converter via the high-speed analog switch, and the low-speed external terminal is coupled to the input of the A/D converter via the low-speed analog switch. A plurality of inputs of a plurality of low-speed digital input buffer circuits and a plurality of outputs of a plurality of low-speed digital output buffer circuits are coupled to a plurality of low-speed external terminals. The output of any digital output buffer circuit is not coupled to a plurality of high-speed external terminals, but a plurality of inputs of a plurality of high-speed digital input buffer circuits is coupled to a plurality of high-speed external terminals. Between a plurality of low-speed external terminals and the input of the A/D converter, a low-speed separating resistor with a high resistance value is coupled, respectively.

20 Claims, 6 Drawing Sheets

SEMICONDUCTOR INTEGRATED CIRCUIT

CROSS-REFERENCE TO RELATED APPLICATION

The disclosure of Japanese Patent Application No. 2010-167274 filed on Jul. 26, 2010 including the specification, drawings and abstract is incorporated herein by reference in its entirety.

BACKGROUND

The present invention relates to semiconductor integrated circuits incorporating an A/D converter, and in particular relates to the techniques for effectively reducing the effect of the noise from a digital terminal in combining an analog terminal of the A/D converter with the digital terminal.

In a semiconductor integrated circuit such as a microcomputer or microcontroller incorporating an A/D converter, an analog signal supplied from the outside is converted to a digital signal by the A/D converter, and the digital signal is supplied to a central processing unit (CPU).

Patent Document 1 (Japanese Patent Laid-Open No. 2005-26805) describes a microcomputer incorporating an A/D converter, wherein an analog multiplexer that selects a plurality of analog signals supplied from a plurality of external terminals is coupled to an input terminal. The incorporated A/D converter is configured as a successive approximation type A/D including a comparator circuit in the form of a sample hold circuit, a digital section, a successive approximation register, and a local D-A converter.

On the other hand, as well known, in the semiconductor integrated circuit, an analog terminal is combined with a digital terminal in order to reduce the number of external terminals. For example, in page 7 of Non-Patent Document 1 (Data Sheet of TC94A58FG "Single-chip CD Processor with Built-in Controller", TOSHIBA CMOS Digital Integrated Circuit Silicon Monolithic, pp. 1-20, 2005-12-7, from http://www.semicon.toshiba.co.jp/docs/datasheet/jp/ASSP/TC94A58FG_ja_datasheet_051207.pdf searched on Jul. 5, 2010 with # search='Toshiba CMOS digital integrated circuit silicon monolithic TC94A58FG'), there is a description that four input terminals (analog terminals) of an A/D converter built in one chip processor are combined with I/O port terminals (digital terminals) of an LCD driver. Furthermore, Patent Document 2 (Japanese Patent Laid-Open No. 11-154864) describes that a plurality of analog input terminals of an analog multiplexer coupled to the input terminal of an A/D converter is combined with a multi-bit digital input terminal of a digital multiplexer coupled to the output terminal of the A/D converter.

SUMMARY

Prior to the present invention, the present inventors had been engaging in the development of a general-purpose microcontroller capable of the A/D conversion of a plurality of analog signals. In this general-purpose microcontroller, not only the number of channels of analog signals to be A/D-converted by the A/D converter is quite a lot, but also the analog signals of a considerable number of channels need to be A/D-converted at high speed.

Under such development circumstances, prior to the present invention, the present inventors considered employing a hierarchical signal line structure in an analog multiplexer coupled to the input terminal of an A/D converter. The hierarchical signal line structure includes a trunk signal line and a branch signal line. A plurality of high-speed external analog terminals of a semiconductor integrated circuit, to which a plurality of analog signals of high-speed channels is supplied, is coupled to the trunk signal line via a plurality of high-speed analog switches, and the trunk signal line is coupled to a sampling capacitor of the input terminal of the A/D converter. On the other hand, a plurality of low-speed external analog terminals of the semiconductor integrated circuit, to which a plurality of analog signals of low-speed channels is supplied, is coupled to the branch signal line via a plurality of low-speed analog switches, and the branch signal line is coupled to the trunk signal line, the input terminal of the A/D converter, and the sampling capacitor via a hierarchical connection switch.

In the analog multiplexer of this hierarchical signal line structure, the hierarchical connection switch is controlled to an off-state in a period during which an analog signal of the high-speed channel is sampled by the sampling capacitor. Accordingly, the parasitic capacitance of the branch signal line is electrically isolated from the trunk signal line and therefore the analog signal of the high-speed channel can be sampled at high speed by the sampling capacitor of the trunk signal line. In contrast, in a period during which an analog signal of a low-speed channel is sampled by the sampling capacitor, the hierarchical connection switch is controlled to an on-state. Accordingly, the branch signal line is electrically coupled to the trunk signal line and therefore the analog signal of the low-speed channel is sampled by the sampling capacitor of the trunk signal line via the branch signal line. When the sampling period ends, the state transitions to a hold period, in which the analog voltage sampled by the sampling capacitor can be A/D-converted to a digital signal by the A/D converter.

On the other hand, also in the analog multiplexer of this hierarchical signal line structure, the analog terminal needs to be combined with the digital terminal in order to reduce the number of external terminals of the semiconductor integrated circuit. Accordingly, a plurality of high-speed external analog terminals, to which a high-speed analog signal is supplied, and a plurality of low-speed external analog terminals, to which a low-speed analog signal is supplied, need to be combined with the digital terminals.

However, the result of the study performed by the present inventors prior to the present invention revealed a problem in which with this combined analog and digital terminals, a digital signal of the digital terminal cross-talks as a noise with the sampling capacitor of the A/D converter of the trunk signal line of the hierarchical signal line structure. The present inventors obtained the following results of the study by examining the mechanism of this crosstalk noise problem.

First, in the high-speed external analog terminal, a P-channel MOS transfer transistor and an N-channel MOS transfer transistor of a CMOS analog switch constituting the high-speed analog switch are set to have a relatively large element size so as to make the on-resistance smaller. As a result, the CMOS analog switch constituting the high-speed analog switch has a relatively large parasitic capacitance and therefore the noise of a digital signal at the high-speed external analog terminal combined with the digital terminal cross-talks with the sampling capacitor of the A/D converter of the trunk signal line of the hierarchical signal line structure via the high-speed analog switch having relatively large parasitic capacitance.

On the other hand, in the low-speed external analog terminal, a P-channel MOS transfer transistor and an N-channel MOS transfer transistor of a CMOS analog switch constituting the low-speed analog switch are set to have a relatively small element size because there is no need to make the on-resistance extremely smaller. Furthermore, when the low-speed external analog terminal is used as a digital terminal, the hierarchical connection switch between the branch signal line and the trunk signal line is controlled to an off-state. However, when the signal amplitude of a digital signal of the low-speed external analog terminal combined with the digital terminal is large, the digital signal cross-talks with the sampling capacitor of the A/D converter of the trunk signal line of the hierarchical signal line structure as a noise via the parasitic capacitance of the hierarchical connection switch in the off-state and the parasitic capacitance of the CMOS analog switch of the low-speed analog switch in the off-state.

The present invention has been made as the result of the study performed by the present inventors prior to the present invention.

Accordingly, the present invention has been made in view of the above circumstances and provides technology to reduce the effect of the noise from the digital terminal in combining an analog terminal of the A/D converter with a digital terminal, in a semiconductor integrated circuit incorporating an A/D converter.

The other purposes and the new features of the present invention will become clear from the description of the present specification and the accompanying drawings.

The following explains briefly a typical invention among the inventions disclosed in the present application.

That is, a semiconductor integrated circuit (MPU) according to a typical embodiment of the present invention includes a plurality of high-speed external terminals ($T_{H1}$, $T_{H2}$, ..., and $T_{HN}$), a plurality of low-speed external terminals ($T_{S1}$ and $T_{S2}$) a plurality of high-speed analog switches ($SW_{H1}$, $SW_{H2}$, ..., and $SW_{EN}$) a plurality of low-speed analog switches ($SW_{S1}$ and $SW_{S2}$) and an A/D converter (ADC).

Each terminal of the high-speed external terminals is coupled to the input terminal of the A/D converter via each switch of the high-speed analog switches.

Each terminal of the low-speed external terminals is coupled to the input terminal of the A/D converter via each switch of the low-speed analog switches.

A plurality of input terminals of a plurality of low-speed digital input buffer circuits ($In_{S1}$ and $In_{S2}$) and a plurality of output terminals of a plurality of low-speed digital output buffer circuits ($Out_{S1}$ and $Out_{S2}$) are coupled to the low-speed external terminals, respectively.

The output terminal of any digital output buffer circuit is not coupled, but a plurality of input terminals of a plurality of high-speed digital input buffer circuits ($In_{H1}$, $In_{H2}$, and $In_{HN}$) is coupled to the high-speed external terminals, respectively.

Figure 1:
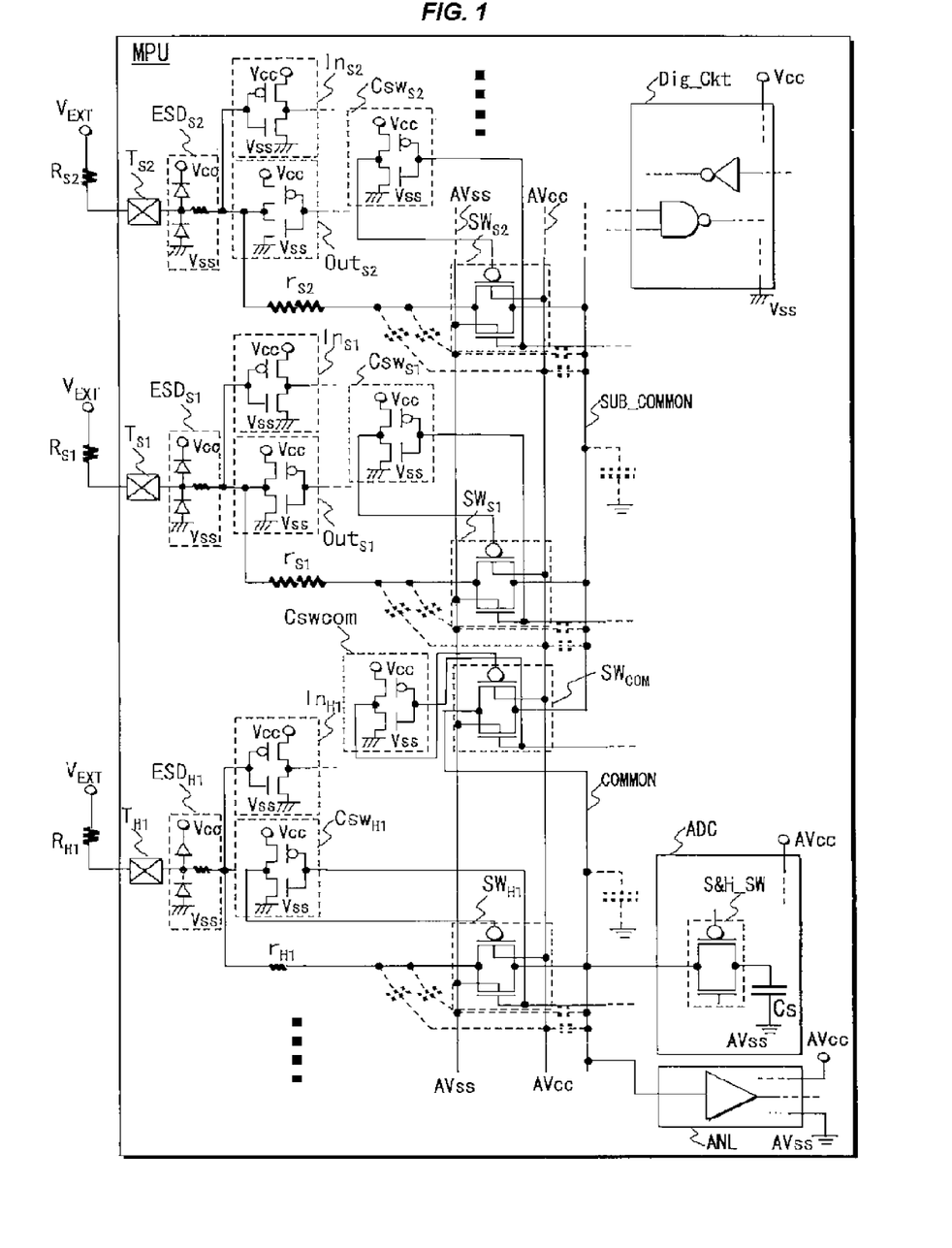
FIG. 1 is a diagram illustrating an overall configuration of a micro-controller unit MPU according to Embodiment 1 of the present invention.
Figure 5:
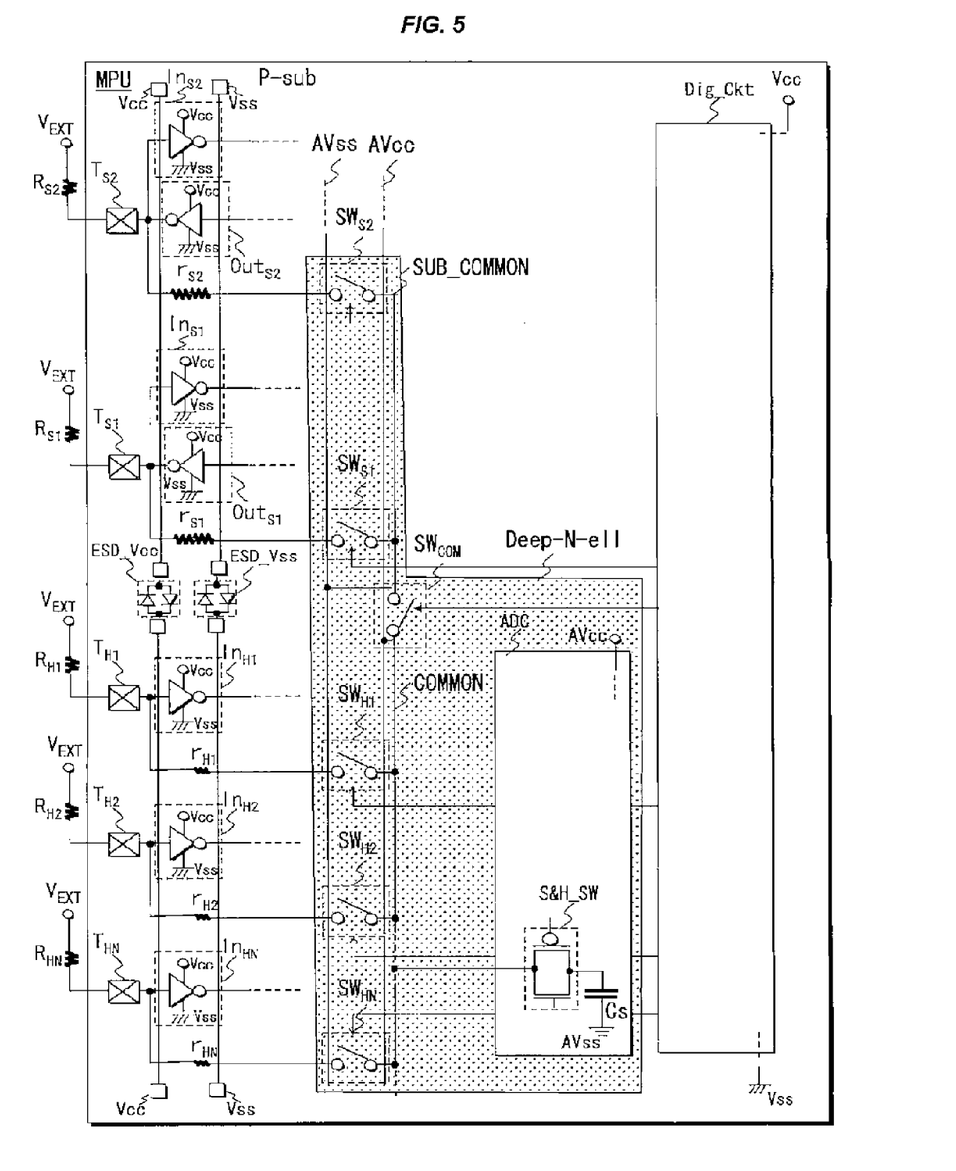
FIG. 5 is a diagram illustrating that the micro-controller unit MPU shown in FIG. 1 specifically includes a large number of high speed external analog terminals $T_{H1}$ $T_{H2}$ and $T_{HN}$ and a large number of low-speed external analog terminals $T_{S1}$ and $T_{S2}$.

Between each terminal of the low-speed external terminals and the input terminal of the A/D converter, a low-speed separating resistor ($r_{S1}$ and $r_{S2}$) set to a resistance value higher than a resistance value between each terminal of the high-speed external terminals and the input terminal of the A/D converter is coupled (see FIG. 1 and FIG. 5).

The following explains briefly the effects acquired by the typical invention among the inventions disclosed in the present application.

That is, according to the present invention, in combining an analog terminal of an A/D converter with a digital terminal, the noise from the digital terminal can be reduced.

DETAILED DESCRIPTION

1. Overview of Embodiments

First, the outline of a typical embodiment among the inventions disclosed in the present application is described. The reference numerals of the accompanying drawings referred to with parentheses in the description of the outline of the typical embodiment simply illustrate those contained in the concept of a constituent element attached with the parentheses.

[1] The semiconductor integrated circuit (MPU) according to the typical embodiment of the present invention includes a plurality of high-speed external terminals ($T_{H1}$ $T_{H2}$, ..., and $T_{HN}$), a plurality of low-speed external terminals ($T_{S1}$ and $T_{H2}$), a plurality of high-speed analog switches ($SW_{H1}$, $SW_{H2}$, ..., and $SW_{HN}$), a plurality of low-speed analog switches ($SW_{S1}$, $SW_{S2}$), and an A/D converter (ADC).

Each terminal of the high-speed external terminals is connectable to an input terminal of the A/D converter via each switch of the high-speed analog switches.

Each terminal of the low-speed external terminals is connectable to the input terminal of the A/D converter via each switch of the low-speed analog switches.

A plurality of input terminals of a plurality of low-speed digital input buffer circuits ($In_{S1}$ and $In_{S2}$) and a plurality of output terminals of a plurality of low-speed digital output buffer circuits ($Out_{S1}$ and $Out_{S2}$) are coupled to the low-speed external terminals, respectively.

The output terminal of any digital output buffer circuit is not coupled, but a plurality of input terminals of a plurality of high-speed digital input buffer circuits ($In_{H1}$, $In_{H2}$, and $In_{HN}$) is coupled to the high-speed external terminals, respectively.

Between each terminal of the low-speed external terminals and each switch of the low-speed analog switches, a low-speed separating resistor ($r_{S1}$ and $r_{S2}$) set to a resistance value higher than the resistance value between each terminal of the high-speed external terminals and each switch of the high-speed analog switches is coupled (see FIG. 1, FIG. 5).

According to the embodiment, in combining an analog terminal of the A/D converter with a digital terminal, the effect of the noise from the digital terminal can be reduced.

The semiconductor integrated circuit (MPU) according to a preferred embodiment further includes a common signal line (COMMON), a trunk connection switch ($SW_{COM}$), and a sub-common signal line (SUB_COMMON).

The common signal line is coupled to the input terminal of the A/D converter.

The sub-common signal line is connectable to the common signal line and the input terminal of the A/D converter via the trunk connection switch.

Each terminal of the high-speed external terminals is coupled to the common signal line via each switch of the high-speed analog switches.

Each terminal of the low-speed external terminals is coupled to the sub-common signal line via each switch of the low-speed analog switches (see FIG. 1 and FIG. 5).

According to another preferred embodiment, each switch of the low-speed analog switches comprises a low-speed CMOS analog switch with a predetermined on-resistance and a predetermined element size.

Figure 4:
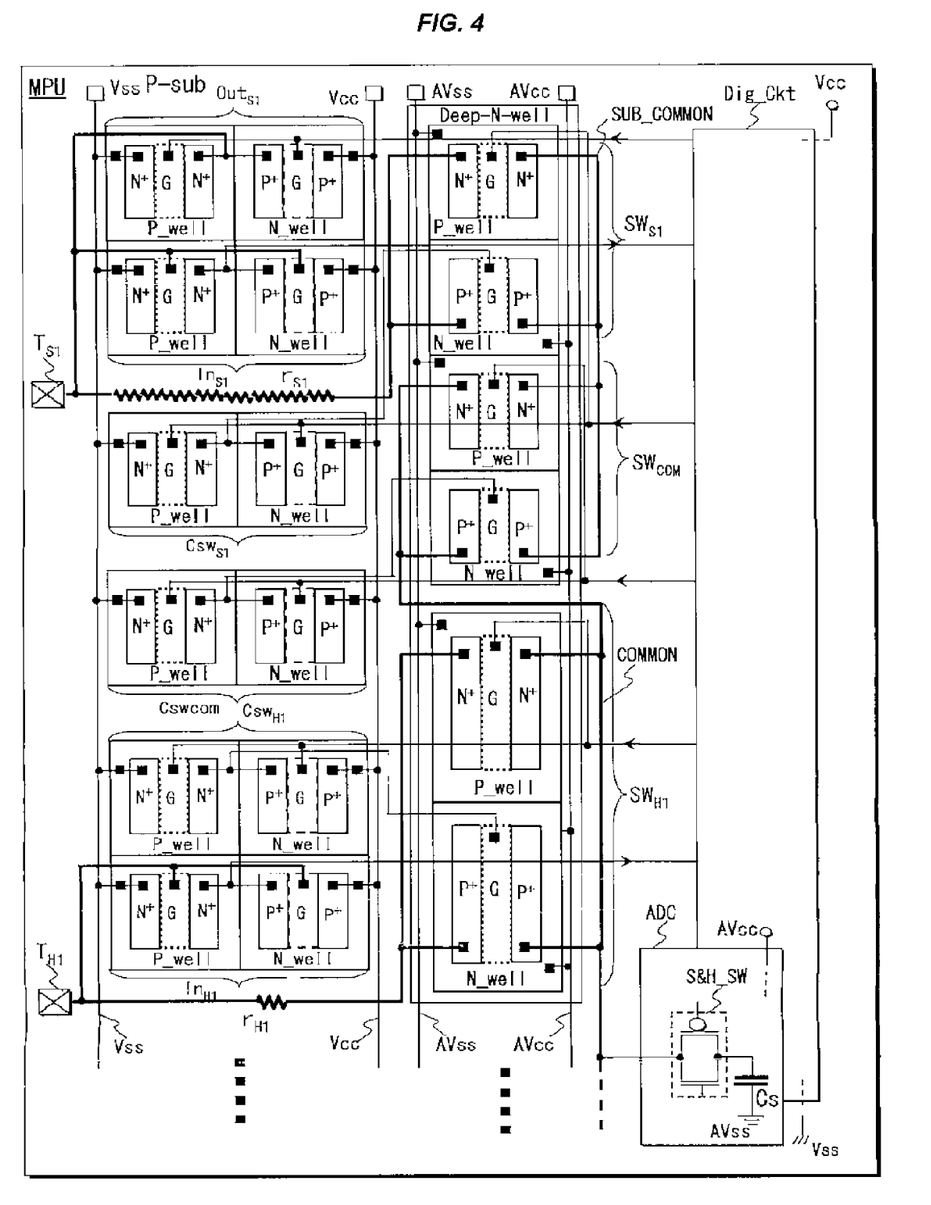
FIG. 4 is a diagram illustrating the digital circuit elements inside the micro-controller unit MPU illustrated in FIG. 1, which are formed using the triple-well structure shown in FIG. 3, and a planar structure thereof.

Each switch of the high-speed analog switches comprises a high-speed CMOS analog switch having an on-resistance smaller than the predetermined on-resistance of the low-speed CMOS analog switch and having an element size larger than the predetermined element size of the low-speed CMOS analog switch (see FIG. 4).

According to yet another preferred embodiment, between each terminal of the high-speed external terminals and each switch of the high-speed analog switches, a high-speed separating resistor ($r_{H1}, r_{H2}, \ldots,$ and $r_{HN}$) set to a resistance value lower than the resistance value of the low-speed separating resistor ($r_{S1}$ and $r_{S2}$) is coupled (see FIG. 1 and FIG. 5).

According to a more preferred embodiment, the trunk connection switch comprises a trunk connection CMOS analog switch with a predetermined on-resistance and a predetermined element size (see FIG. 1 and FIG. 5).

According to a more preferred other embodiment, a plurality of low-speed electrostatic protection circuits ($ESD_{S1}$ and $ESD_{S2}$) is coupled to the low-speed external terminals, and a plurality of high-speed electrostatic protection circuits ($ESD_{H1}, \ldots$) is coupled to the high-speed external terminals.

The semiconductor integrated circuit (MPU) according to yet more preferred other embodiment further includes a digital circuit (Dig_Ckt) to which a digital power supply voltage (Vcc) and a digital ground voltage (Vss) are supplied.

An analog power supply voltage (AVcc) and an analog ground voltage (AVss) are supplied to the A/D converter, the low-speed CMOS analog switch, the high-speed CMOS analog switch, and the trunk connection CMOS analog switch (see FIG. 1 and FIG. 5).

According to a specific embodiment, the digital power supply voltage and the digital ground voltage are supplied to the low-speed digital input buffer circuits, the low-speed digital output buffer circuits, and the high-speed digital input buffer circuits (see FIG. 1 and FIG. 5).

Figure 6:
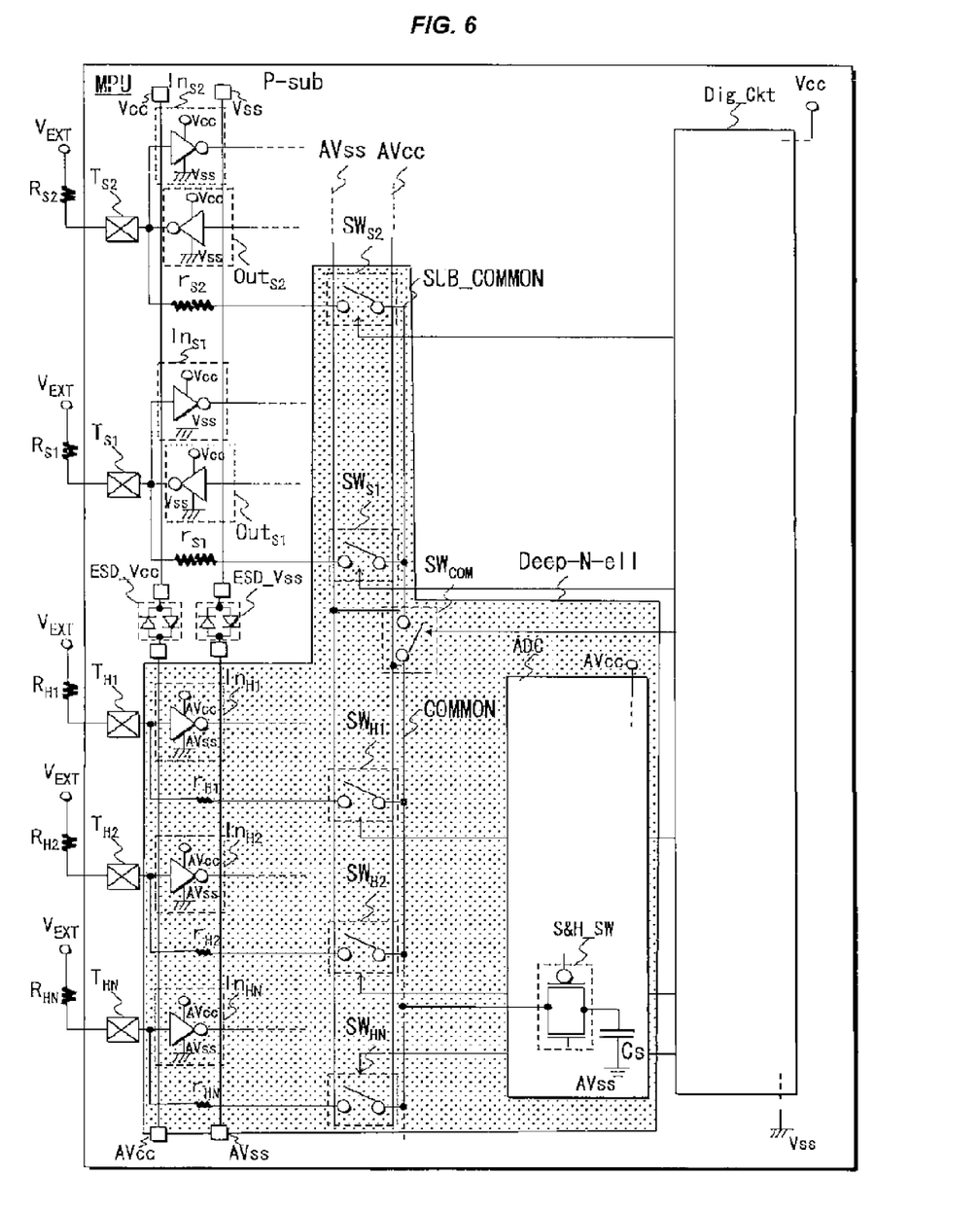
FIG. 6 is a diagram illustrating another specific configuration according to Embodiment 2 of the present invention of the micro-controller unit MPU shown in FIG. 1.

According to a specific other embodiment, the digital power supply voltage and the digital ground voltage are supplied to the low-speed digital input buffer circuits and the low-speed digital output buffer circuits, and the analog power supply voltage and the analog ground voltage are supplied to the high-speed digital input buffer circuits (see FIG. 6).

According to a more specific embodiment, the A/D converter, the low-speed CMOS analog switch, the high-speed CMOS analog switch, and the trunk connection CMOS analog switch are formed in an analog element forming region (Deep-N-well) of the semiconductor integrated circuit, while the digital circuit, the low-speed digital input buffer circuits, the low-speed digital output buffer circuits, and the high-speed digital input buffer circuits are formed in a digital element forming region (P-Sub) of the semiconductor integrated circuit (see FIG. 5).

According to a more specific other embodiment, the A/D converter, the low-speed CMOS analog switch, the high-speed CMOS analog switch, the trunk connection CMOS analog switch, and the high-speed digital input buffer circuits are formed in the analog element forming region (Deep-N-well) of the semiconductor integrated circuit, while the digital circuit, the low-speed digital input buffer circuits, and the low-speed digital output buffer circuits are formed in the digital element forming region (P-Sub) of the semiconductor integrated circuit (see FIG. 6).

According to a preferred and specific embodiment, the digital element forming region and the analog element forming region are electrically isolated from each other inside the semiconductor integrated circuit (see FIG. 5).

According to a preferred and specific other embodiment, the digital element forming region and the analog element forming region are electrically isolated from each other inside the semiconductor integrated circuit (see FIG. 6).

Figure 3:
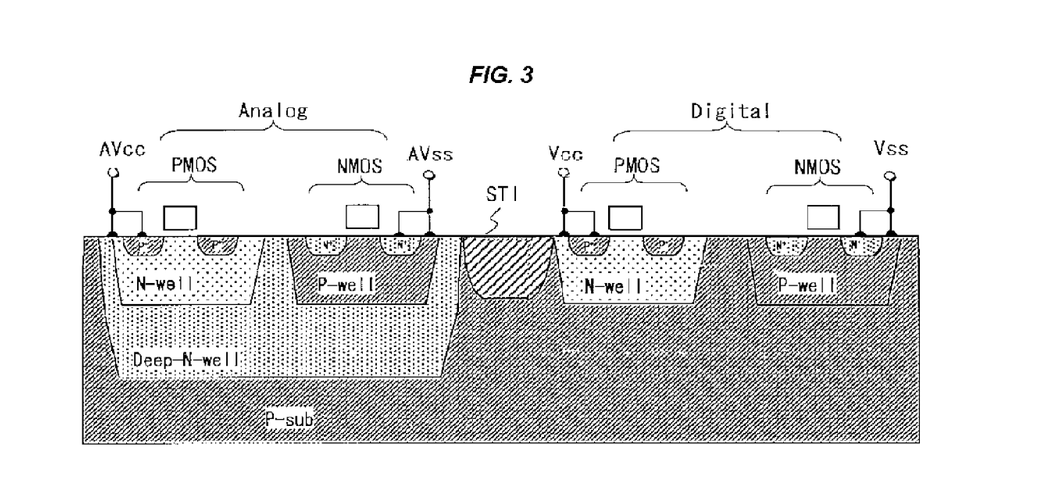
FIG. 3 is a diagram illustrating the structure of triple-well monolithic silicon semiconductor chip having integrated therein the analog circuit elements and digital circuit elements which are incorporated into the micro-controller unit MPU according to Embodiment 1 of the present invention shown in FIG. 1.

According to a preferred and specific other embodiment, the digital element forming region is formed from a P-type silicon substrate of the semiconductor integrated circuit of a triple-well structure, and the analog element forming region is formed from a deep N-type well formed inside the P-type silicon substrate (see FIG. 3).

Figure 7:
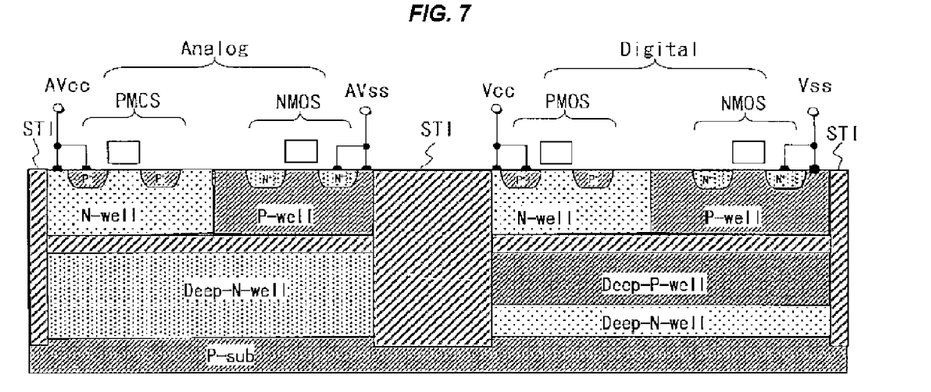
FIG. 7 is a diagram illustrating the structure of an SOI monolithic silicon semiconductor chip according to Embodiment 3 of the present invention having integrated therein the analog circuit elements and digital circuit elements which are incorporated into the micro-controller unit MPU according to Embodiment 1 of the present invention shown in FIG. 1.

According to a yet preferred and specific embodiment, in the semiconductor integrated circuit of an SOI structure, an analog region and a digital region electrically isolated from each other are formed in an upper silicon layer formed above a silicon dioxide layer as an intermediate insulating layer of the SOI structure, and the analog region and the digital region are used as the analog element forming region and the digital element forming region, respectively (see FIG. 7).

Figure 2:
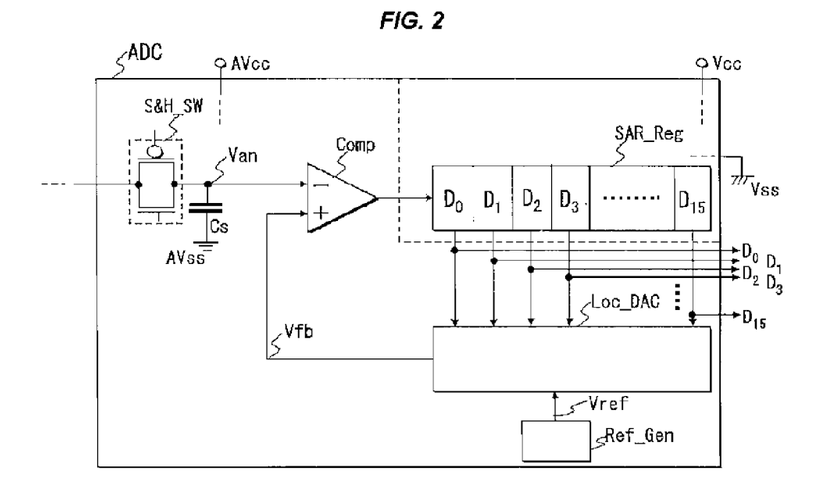
FIG. 2 is a diagram illustrating the configuration of an A/D converter ADC built in the micro-controller unit MPU according to Embodiment 1 of the present invention shown in FIG. 1.

According to a more preferred and specific embodiment, the A/D converter comprises a successive approximation type analog-to-digital converter including a comparator (Comp), a successive approximation register (SAR_Reg), and a local D-A converter (LOC_DAC) (see FIG. 2).

According to another more preferred and specific embodiment, the digital circuit includes a central processing unit (see FIG. 1).

Figure 8:
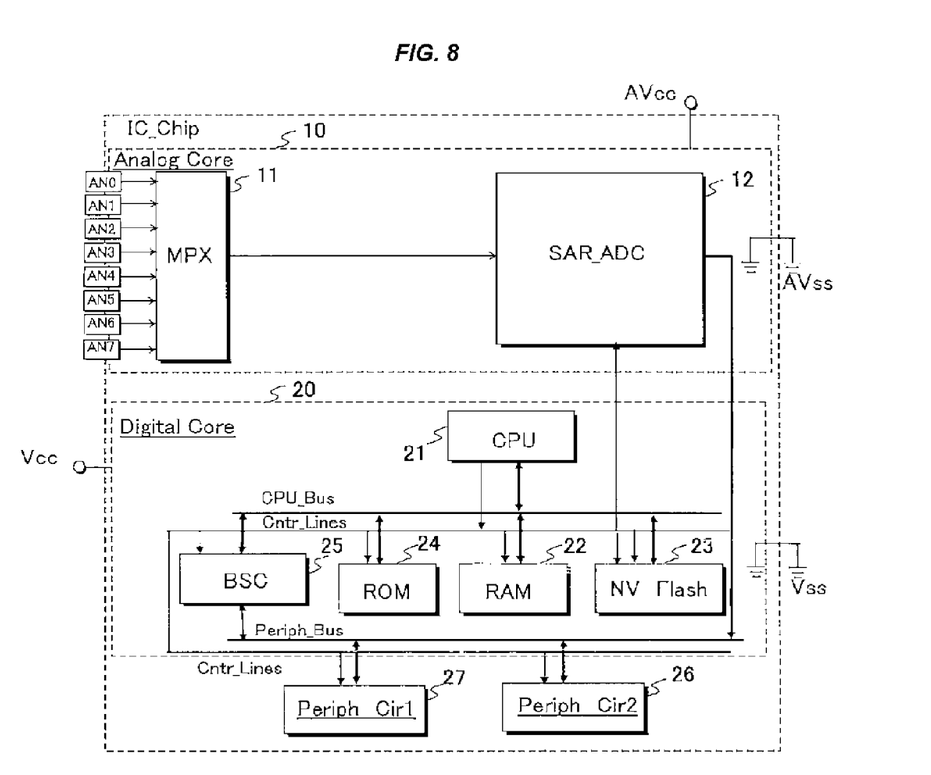
FIG. 8 is a diagram illustrating the configuration of a semiconductor integrated circuit as the micro-controller unit MPU according to Embodiment 4 of the present invention.

According to the most specific embodiment, a plurality of high-speed digital input signals from a plurality of output terminals of the high-speed digital input buffer circuits is supplied to the digital circuit (20), a plurality of digital input signals from a plurality of output terminals of the low-speed digital input buffer circuits is supplied to the digital circuit (20), and a plurality of digital output signals generated from the digital circuit (20) is supplied to a plurality of input terminals of the low-speed digital output buffer circuits (see FIG. 8).

2. Detailed Description of Embodiments

Next, the embodiments will be described more in detail. In all the drawings for explaining the preferred embodiments for implementing the present invention, the same numeral is attached to a component having the same function as that of the preceding drawing, and the repeated explanation thereof is omitted.

Embodiment 1

Overall Configuration of Micro-Controller Unit

FIG. 1 is a diagram illustrating an overall configuration of the micro-controller unit MPU according to Embodiment 1 of the present invention.

The micro-controller unit MPU shown in FIG. 1 is integrated into a semiconductor integrated circuit in the form of a monolithic silicon semiconductor chip.

The micro-controller unit MPU shown in FIG. 1 includes a digital circuit Dig_Ckt, an A/D converter ADC, and other analog circuit ANL. Although not illustrated in FIG. 1, a central processing unit CPU, a digital logic circuit, and a memory circuit are included in the digital circuit Dig_Ckt.

<<A/D Converter and Hierarchical Signal Line Structure>>

The A/D converter ADC includes a sample hold switch S&H_SW and a sampling capacitor Cs. First, the input terminal of the A/D converter ADC is coupled to a trunk signal line called a common signal line COMMON of a hierarchical signal line structure. The common signal line COMMON is coupled to a branch signal line called a sub-common signal line SUB_COMMON via a trunk connection switch $SW_{COM}$. Moreover, the A/D converter ADC operates with an analog power supply voltage AVcc and an analog ground voltage AVss for analog circuits.

<<High-Speed External Analog Terminal>>

An external power supply voltage $V_{EXT}$ is coupled to the high-speed external analog terminal $T_{H1}$ via a resistor $R_{H1}$ constituting a high-speed analog sensor outside the micro-controller unit MPU.

To the common signal line COMMON as the trunk signal line, the high-speed external analog terminal $T_{H1}$ is coupled via a high-speed analog switch $SW_{H1}$. The P-channel MOS transfer transistor and the N-channel MOS transfer transistor of a CMOS analog switch constituting the high-speed analog switch $SW_{H1}$ coupled to the high-speed external analog terminal $T_{H1}$ and common signal line COMMON are set to have a relatively large element size in order to set the on-resistance to a small value. Accordingly, the CMOS analog switch constituting the high-speed analog switch $SW_{H1}$ has a relatively large parasitic capacitance, and therefore there is a risk that when the high-speed external analog terminal $T_{H1}$ is combined with the digital terminal, the noise of a digital signal cross-talks with the sampling capacitor Cs of the A/D converter ADC which is coupled to the common signal line COMMON via the high-speed analog switch $SW_{H1}$ having a relatively large parasitic capacitance.

Accordingly, taking into consideration the risk of this crosstalk, in combining the high-speed external analog terminal $T_{H1}$ with the digital terminal, only the high-speed digital input buffer circuit $In_{H1}$ is coupled to the high-speed external analog terminal $T_{H1}$. This is because the high-speed digital input buffer circuit $In_{H1}$ will not generate a high level noise to the high-speed external analog terminal $T_{H1}$. If the high-speed digital output buffer circuit is coupled to the high-speed external analog terminal $T_{H1}$, the high-speed digital output buffer circuit will generate a high level noise to the high-speed external analog terminal $T_{H1}$.

<<High-Speed Electrostatic Protection Circuit>>

Moreover, a high-speed electrostatic protection circuit $ESD_{H1}$ is coupled to the high-speed external analog terminal $T_{H1}$, the high-speed digital input buffer circuit $In_{H1}$, and the high-speed analog switch $SW_{H1}$. The high-speed electrostatic protection circuit $ESD_{H1}$ has a function to prevent the high-speed digital input buffer circuit $In_{H1}$ and the high-speed analog switch $SW_{H1}$ from being electrostatically destroyed by an external surge voltage supplied to the high-speed external analog terminal $T_{H1}$. Moreover, the high-speed electrostatic protection circuit $ESD_{H1}$ includes a high-level clamp diode coupled between the digital power supply voltage Vcc and the high-speed external analog terminal $T_{H1}$ and a low-level clamp diode coupled between the digital ground voltage Vss and the high-speed external analog terminal $T_{H1}$.

<<High Speed Switch Control Circuit>>

Moreover, in order to drive the gate electrode of the P-channel MOS transfer transistor and the gate electrode of the N-channel MOS transfer transistor of the CMOS analog switch constituting the high-speed analog switch $SW_{H1}$ with control signals having opposite phases, a high speed switch control circuit $Csw_{H1}$ is coupled to the high-speed analog switch $SW_{H1}$. The high speed switch control circuit $Csw_{H1}$ comprises a CMOS inverter including a P-channel MOS transistor and an N-channel MOS transistor, wherein the input terminal and output terminal of this CMOS inverter are coupled to the gate electrode of the N-channel MOS transfer transistor and the gate electrode of the P-channel MOS transfer transistor of the CMOS analog switch constituting the high-speed analog switch $SW_{H1}$, respectively.

Moreover, the digital power supply voltage Vcc and the digital ground voltage Vss for digital circuits are supplied to the high speed switch control circuit $Csw_{in}$, the high-speed electrostatic protection circuit $ESD_{H1}$, and the digital input buffer circuit $In_{H1}$.

<<High-Speed Separating Resistor>>

Although not illustrated in FIG. 1, to the high-speed external analog terminal $T_{H1}$ combined with the digital terminal, a digital input signal generated from other digital circuit (not illustrated) is supplied. On the other hand, the resistance value of the external resistor $R_{H1}$ constituting the high-speed analog sensor coupled to the high-speed external analog terminal $T_{H1}$ is set to a relatively low resistance value of approximately 500Ω to 1.5 kΩ. Accordingly, due to the external resistor $R_{H1}$ of this low resistance value, the input voltage amplitude of a digital input signal applied to the high-speed external analog terminal $T_{H1}$ becomes a low voltage amplitude.

In order to reduce the amount of crosstalk with the common signal line COMMON via the high-speed analog switch $SW_{H1}$ due to the noise component of the digital input signal of a low-voltage amplitude applied to the high-speed external analog terminal $T_{H1}$, the high-speed separating resistor $r_{H1}$ set to a relatively low resistance is coupled between the high-speed external analog terminal $T_{H1}$ and the common signal line COMMON. Actually, the high-speed separating resistor $r_{H1}$ is coupled between the internal resistor of the high-speed electrostatic protection circuit $ESD_{H1}$ and the analog input terminal of the high-speed analog switch $SW_{H1}$.

Moreover, the resistance value of the high-speed separating resistor $r_{H1}$ is set to a low resistance value of approximately 5Ω so as not to interfere with fast analog-signal transfer of the high-speed analog switch $SW_{H1}$. Accordingly, the high-speed separating resistor comprises, for example, a doped polysilicon resistor utilizing the upper polysilicon of the double-layer polysilicon of a nonvolatile transistor of a built-in flash memory of the micro-controller unit MPU. Accordingly, due to the fast analog-signal transfer of the high-speed analog switch $SW_{H1}$, the A/D converter ADC with a 1.0μ Sec conversion rate can be realized using the high-speed external analog terminal $T_{H1}$.

<<Other Analog Circuits>>

Moreover, not only the sample hold switch S&H_SW of the A/D converter ADC but an input terminal of other analog circuit ANL are coupled to the common signal line COMMON. Also to the other analog circuit ANL, the analog power supply voltage AVcc and the analog ground voltage AVss for analog circuits are supplied. The examples of the other analog circuit ANL may include a general-purpose comparator, an abnormality detection window comparator, an operational amplifier, a programmable gain amplifier, and the like.

<<Low-Speed External Analog Terminal>>

To the low-speed external analog terminals $T_{S1}$ and $T_{S2}$, the external power supply voltage $V_{EXT}$ is coupled via resistors $R_{S1}$ and $R_{S2}$ each constituting a low-speed analog sensor outside the micro-controller unit MPU.

To the sub-common signal line SUB_COMMON as the branch signal line, the low-speed external analog terminals $T_{S1}$ and $T_{S2}$ are coupled via low-speed analog switches $SW_{S1}$ and $SW_{S2}$. The P-channel MOS transfer transistor and N-channel MOS transfer transistor of the CMOS analog switch constituting the low-speed analog switches $SW_{S1}$ and $SW_{S2}$ coupled to the low-speed external analog terminals $T_{S1}$ and $T_{S2}$ and the sub-common signal line SUB_COMMON are set to have a relatively small element size because there is no need to set the on-resistance to an extremely small value. Accordingly, the CMOS analog switch constituting the low-speed analog switches $SW_{S1}$ and $SW_{S2}$ has a relatively small parasitic capacitance. Therefore, the amount of crosstalk is small in such a case where in combining the low-speed external analog terminals $T_{S1}$ and $T_{S2}$ with the digital terminals, the noise of a digital signal cross-talks with the sampling capacitor Cs of the A/D converter ADC coupled to the common signal line COMMON via the low-speed analog switches $SW_{S1}$ and $SW_{S2}$ having a relatively small parasitic capacitance, the trunk connection switch $SW_{COM}$, and the sub-common signal line SUB_COMMON.

As a result, taking into consideration this small amount of crosstalk, in combining the low-speed external analog terminals $T_{S1}$ and $T_{S2}$ with the digital terminals, not only the low-speed digital input buffer circuits $In_{S1}$ and $In_{S2}$ but the low-speed digital output buffer circuits $Out_{S1}$ and $Out_{S2}$ are coupled to the low-speed external analog terminals $T_{S1}$ and $T_{S2}$ <<Low-Speed Separating Resistor>>

Accordingly, in order to reduce the amount of crosstalk of the common signal line COMMON due to the noise component of the digital output signals from the low-speed digital output buffer circuits $Out_{S1}$ and $Out_{S2}$ coupled to the low-speed external analog terminals $T_{S1}$ and $T_{S2}$, the low-speed separating resistors $r_{S1}$ and $r_{S2}$ set to a relatively high resistance value are coupled between the low-speed external analog terminals $T_{S1}$ and $T_{S2}$ and the common signal line COMMON. Actually, the low-speed separating resistors $r_{S1}$ and $r_{S2}$ are coupled between the internal resistors of the low-speed electrostatic protection circuits $ESD_{S1}$ and $ESD_{S2}$ and the analog input terminals of the low-speed analog switches $SW_{S1}$ and $SW_{S2}$, respectively.

Moreover, the resistance values of the low-speed separating resistors $r_{S1}$ and $r_{S2}$ are set to a relatively high resistance value of approximately 1 kΩ in order to reduce the amount of crosstalk of the common signal line COMMON due to the noise component of the digital output signals from the low-speed digital output buffer circuits $Out_{S1}$ and $Out_{S2}$. Accordingly, the low-speed separating resistors $r_{S1}$ and $r_{S2}$ comprise, for example, a low-doped polysilicon resistor utilizing the lower polysilicon of the double-layer polysilicon of the non-volatile transistor of the built-in flash memory of the micro-controller unit MPU. Accordingly, due to the analog signal transfer of the low-speed analog switches $SW_{S1}$ and $SW_{S2}$, the A/D converter ADC with a 2.0μ Sec conversion rate can be realized using the low-speed external analog terminals $T_{S1}$ and $T_{S2}$.

<<Low-Speed Electrostatic Protection Circuit>>

Moreover, the low-speed electrostatic protection circuits $ESD_{S1}$ and $ESD_{S2}$ are coupled to the low-speed external analog terminals $T_{S1}$ and $T_{S2}$ the low-speed digital input buffer circuits $In_{S1}$ and $In_{S2}$, the low-speed digital output buffer circuits $Out_{S1}$ and $Out_{S2}$, and the low-speed separating resistors $r_{S1}$ and $r_{S2}$. That is, the low-speed electrostatic protection circuits $ESD_{S1}$ and $ESD_{S2}$ have a function to prevent the low-speed digital input buffer circuits $In_{S1}$ and $In_{S2}$, the low-speed digital output buffer circuits $Out_{S1}$ and $Out_{S2}$, and the low-speed separating resistors $r_{S1}$ and $r_{S2}$ from being electrostatically destroyed by an external surge voltage supplied to the low-speed external analog terminals $T_{S1}$ and $T_{S2}$. Moreover, the low-speed electrostatic protection circuits $ESD_{S1}$ and $ESD_{S2}$ include a high-level clamp diode coupled between the digital power supply voltage Vcc and the low-speed external analog terminals $T_{S1}$ and $T_{S2}$ and a low-level clamp diode coupled between the digital ground voltage Vss and the low-speed external analog terminals $T_{S1}$ and $T_{S2}$.

<<Low-Speed Switch Control Circuit>>

Moreover, in order to drive the gate electrode of a P-channel MOS transfer transistor and the gate electrode of an P-channel MOS transfer transistor of a CMOS analog switch constituting the low-speed analog switches $SW_{S1}$ and $SW_{S2}$ with control signals having opposite phases, low-speed switch control circuits $Csw_{S1}$ and $Csw_{S2}$ are coupled to the low-speed analog switches $SW_{S1}$ and $SW_{S2}$, respectively. The low-speed switch control circuits $Csw_{S1}$ and $Csw_{S2}$ comprise a CMOS inverter including a P-channel MOS transistor and an N-channel MOS transistor, and the input terminal and output terminal of this CMOS inverter are coupled to the gate electrode of the N-channel MOS transfer transistor and the gate electrode of the P-channel MOS transfer transistor of the CMOS analog switch constituting the low-speed analog switches $SW_{S1}$ and $SW_{S2}$, respectively.

Moreover, the digital power supply voltage Vcc and the digital ground voltage Vss for digital circuits are supplied to the low-speed switch control circuits $Csw_{S1}$ and $Csw_{S2}$, the low-speed electrostatic protection circuits $ESD_{S1}$ and $ESD_{S2}$, the low-speed digital input buffer circuits $In_{S1}$ and $In_{S2}$, and the low-speed digital output buffer circuits $Out_{S1}$ and $Out_{S2}$, respectively.

Although not illustrated in FIG. 1, also to the low-speed external analog terminals $T_{S1}$ and $T_{S2}$ combined with the digital terminals, the digital input signal generated from other digital circuit (not illustrated) is supplied. On the other hand, the resistance values of the external resistors $R_{S1}$ and $R_{S2}$ constituting the low-speed analog sensor coupled to the low-speed external analog terminals $T_{S1}$ and $T_{S2}$ are set to a relatively low resistance value of approximately 500Ω to 1.5 kΩ.

<<Trunk Connection Switch>>

The common signal line COMMON and the sub-common signal line SUB_COMMON are connectable to each other by the trunk connection switch $SW_{COM}$. In order to drive the gate electrode of the P-channel MOS transfer transistor and the gate electrode of the N-channel MOS transfer transistor of the CMOS analog switch constituting the trunk connection switch $SW_{COM}$ with control signals having opposite phases, a trunk connection switch control circuit $Csw_{COM}$ is coupled to the trunk connection switch $SW_{COM}$. The trunk connection switch control circuit $Csw_{COM}$ comprises a CMOS inverter including a P-channel MOS transistor and an N-channel MOS transistor, and the input terminal and output terminal of this CMOS inverter are coupled to the gate electrode of the N-channel MOS transfer transistor and the gate electrode of the P-channel MOS transfer transistor of the CMOS analog switch constituting the trunk connection switch $SW_{COM}$, respectively.

<<Configuration of Successive Approximation Type A/D Converter>>

FIG. 2 is a diagram showing the configuration of the A/D converter ADC built in the micro-controller unit MPU according to Embodiment 1 of the present invention illustrated in FIG. 1.

As illustrated in FIG. 2, the A/D converter ADC comprises a successive approximation type analog-to-digital converter including the sample hold switch S&H_SW, the sampling capacitor Cs, a comparator Comp, a successive approximation register SAR_Reg, a local D-A converter LOC_DAC, and a reference voltage generator Ref_Gen.

As the other A/D converter ADC, an ultra high-speed flash type A/D converter has a drawback of having an extremely high power consumption, a high-speed pipeline type A/D converter has a drawback of having a relatively high power consumption, and a high resolution ΣΔ A/D converter has drawbacks that a decimation filter of an output section is required, that a circuit of a complicated multistage quantization noise suppression scheme called MASH (Multistage Noise Shaping) is required in order to reduce the quantization noise, and that the circuit design is difficult. In contrast, the A/D converter ADC comprising the successive approximation type analog-to-digital converter illustrated in FIG. 2 has advantages of having extremely low power consumption and providing a relatively high resolution of 16 bits and also providing easy circuit design.

In the A/D converter ADC illustrated in FIG. 2, an analogue feedback voltage Vfb, which is generated by the local D-A converter LOC_DAC in response to 16 bit digital signals D0, D1, D2, D3, . . . and D15 from the successive approximation register SAR_Reg and a reference voltage Vref generated from the reference voltage generator Ref_Gen, is compared with an analog input voltage Van of the sampling capacitor Cs by the comparator Comp during a hold period of the sample hold switch S&H_SW. In response to the analog comparison result, the comparator Comp updates the digital value of 16 bit digital signals $D_0$, $D_1$, $D_2$, $D_3$, . . . , and $D_{15}$ of the successive approximation register SAR_Reg according to a predetermined search algorithm, for example, such as a binary search. Accordingly, the voltage level of the analogue feedback voltage Vfb will successively approximate the voltage level of the analog input voltage Van, so that the analog input voltage Van A/D is converted to 16 bit digital signals $D_0$, $D_1$, $D_2$, $D_3$ and $D_{15}$. It should be noted that, in the A/D converter ADC illustrated in FIG. 2, the analog power supply voltage AVcc and the analog ground voltage AVss for analog circuits are supplied to the analog circuits of the sample hold switch S&H_SW, the sampling capacitor Cs, the comparator Comp, the local D-A converter LOC_DAC, and the reference voltage generator Ref_Gen. On the other hand, the digital power supply voltage Vcc and the digital ground voltage Vss for digital circuits are supplied to the successive approximation register SAR_Reg generating the 16 bit digital signals of the A/D converter ADC.

<<Semiconductor Chip Having Integrated Therein Analog Circuit Elements and Digital Circuit Elements>>

FIG. 3 is a view showing the structure of a triple-well monolithic silicon semiconductor chip having integrated therein the analog circuit elements and digital circuit elements which are incorporated into the micro-controller unit MPU according to Embodiment 1 of the present invention illustrated in FIG. 1.

The structure of the monolithic silicon semiconductor chip illustrated in FIG. 3 is called a triple-well structure, wherein a deep N-type well Deep-N-well is formed in a P-type silicon substrate P-sub. An N-type well N-well and a P-type well P-well are formed in the deep N-type well Deep-N-well, wherein a P-channel MOS transistor PMOS and an N-channel MOS transistor NMOS which are analog circuit elements are formed in the N-type well N-well and the P-type well P-well, respectively. The analog power supply voltage AVcc for analog circuits is applied to the deep N-type well Deep-N-well, the N-type well N-well, and a $P^+$-type source region of a high impurity concentration of the P-channel MOS transistor PMOS which is the analog circuit element. The analog ground voltage AVss for analog circuits is applied to the P-type well P-well and an $N^+$-type source region of high impurity concentration of the N-channel MOS transistor NMOS which is the analog circuit element.

The N-type well N-well and the P-type well P-well are formed in other surface of the P-type silicon substrate P-sub, wherein in the N-type well N-well and the P-type well P-well, the P-channel MOS transistor PMOS and the N-channel MOS transistor NMOS which are digital circuit elements are formed, respectively. The digital power supply voltage Vcc for digital circuits is applied to the N-type well N-well and the $P^+$-type source region of a high impurity concentration of the P-channel MOS transistor PMOS which is the digital circuit element. Moreover, the digital ground voltage Vss for digital circuits is applied to the P-type well P-well and the $N^+$-type source region of a high impurity concentration of the N-channel MOS transistor NMOS which is the digital circuit element. Furthermore, in other surface of the P-type silicon substrate P-sub, between an analog circuit element Analog and a digital circuit element Digital, there is formed a silicon dioxide insulating layer formed by shallow trench isolation (STI) for element isolation.

<<Digital Circuit Elements and Planar Structure Thereof>>

FIG. 4 is a view showing the digital circuit elements inside the micro-controller unit MPU illustrated in FIG. 1, which are formed using the triple-well structure illustrated in FIG. 3, and a planar structure thereof.

In FIG. 4, the high-speed electrostatic protection circuit $ESD_{H1}$ and the low-speed electrostatic protection circuits $ESD_{S1}$ and $ESD_{S2}$ illustrated in FIG. 1 are omitted.

As shown in FIG. 4, each digital circuit of the low-speed digital input buffer circuits $In_{S1}$ and $In_{S2}$, the low-speed digital output buffer circuits $Out_{S1}$ and $Out_{S2}$, the low-speed switch control circuit CswS1, and the trunk connection switch control circuit $Csw_{COM}$ near the low-speed external analog terminals $T_{S1}$ and $T_{S2}$ and the high-speed digital input buffer circuit $In_{H1}$ and the high speed switch control circuit $Csw_{H1}$ near the high-speed external analog terminal $T_{H1}$ is formed in the surface of the P-type silicon substrate P-sub of a triple-well structure of a monolithic silicon semiconductor chip. The digital ground voltage Vss and the digital power supply voltage Vcc for digital circuits are applied to each of these digital circuits, as shown in FIG. 4. That is, the digital ground voltage Vss is applied to the P-type well P-well and the $N^+$-type source region of a high impurity concentration of the N-channel MOS transistor NMOS of each digital circuit, while the digital power supply voltage Vcc is applied to the N-type well N-well and the $P^+$-type source region of a high impurity concentration of the P-channel MOS transistor PMOS of each digital circuit.

Furthermore, as shown in FIG. 4, each analog circuit of the low-speed analog switch $SW_{S1}$, the trunk connection switch $SW_{COM}$, and the high-speed analog switch $SW_{H1}$ is formed inside the deep N-type well Deep-N-well formed in the surface of the P-type silicon substrate P-sub. The analog power supply voltage AVcc for analog circuits is applied to the deep N-type well Deep-N-well via the N-type well N-well. Accordingly, each analog circuit formed inside the deep N-type well Deep-N-well can be shielded from the digital noise of each digital circuit formed in the surface of the P-type silicon substrate P-sub.

The analog ground voltage AVss and the analog power supply voltage AVcc for analog circuits are applied to each of these analog circuits, as shown in FIG. 4. That is, the analog ground voltage AVss is applied to the P-type well P-well of each analog circuit, while the analog power supply voltage AVcc is applied to the N-type well N-well of each analog circuit.

Moreover, as shown in FIG. 4, digital control signals for on-off control of the low-speed analog switch SWS1, the on-off control of the trunk connection switch $SW_{COM}$, and the on-off control of the high-speed analog switch $SW_{H1}$ are generated from the digital circuit Dig_Ckt on the right side of FIG. 4. Furthermore, the digital input signals of the low-speed digital output buffer circuits $Out_{S1}$ and $Out_{S2}$ on the left of FIG. 4 are supplied from the digital circuit Dig_Ckt on the right side of FIG. 4. Moreover, the digital output signals generated from the low-speed digital input buffer circuits $In_{S2}$ and $In_{S2}$ and the high-speed digital input buffer circuit $In_{H1}$ on the left of FIG. 4 are supplied to the digital circuit Dig_Ckt on the right side FIG. 4. In addition, the digital power supply voltage Vcc and the digital ground voltage Vss for digital circuits are supplied to the digital circuit Dig_Ckt on the right side.

Furthermore, as shown in FIG. 4, the analog input terminal of the A/D converter ADC, to which the analog ground voltage AVss and the analog power supply voltage AVcc for analog circuits are applied, is coupled to the common signal line COMMON to which the trunk connection switch $SW_{COM}$ and the high-speed analog switch $SW_{H1}$ are coupled.

<<Specific Configuration of Micro-Controller Unit>>

FIG. 5 is a view showing that the micro-controller unit MPU illustrated in FIG. 1 specifically includes a large number of high speed external analog terminals $T_{H1}, T_{H2}, \ldots,$ and $T_{HN}$ and a large number of low-speed external analog terminals $T_{S1}$ and $T_{S2}$.

As shown in FIG. 5, to the first high-speed external analog terminal $T_{H1}$, the high-speed digital input buffer circuit $In_{H1}$ and one end of the high-speed analog switch $SW_{H1}$ are coupled and the other end of the high-speed analog switch $SW_{H1}$ is coupled to the common signal line COMMON. To the second high-speed external analog terminal $T_{H2}$, the high-speed digital input buffer circuit $In_{H2}$ and one end of the high-speed analog switch $SW_{H2}$ are coupled and the other end of the high-speed analog switch $SW_{H2}$ is coupled to the common signal line COMMON. To the N-th high-speed external analog terminal $T_{HN}$, the high-speed digital input buffer circuit $In_{HN}$ and one end of the high-speed analog switch $SW_{HN}$ are coupled and the other end of the high-speed analog switch $SW_{HN}$ is coupled to the common signal line COMMON. In particular, between the first high-speed external analog terminal $T_{H1}$ and the high-speed analog switch $SW_{H1}$, the high-speed separating resistor $r_{H1}$ set to a low resistance value of approximately 5Ω is coupled. Similarly, between the second high-speed external analog terminal $T_{H2}$ and the high-speed analog switch $SW_{H2}$, the high-speed separating resistor $r_{H2}$ set to a low resistance value of approximately 5Ω is coupled, and between the N-th high-speed external analog terminal $T_{HN}$ and the high-speed analog switch $SW_{HN}$, the high-speed separating resistor $r_{HN}$ set to a low resistance value of approximately 5Ω is coupled.

As shown in FIG. 5, the low-speed digital input buffer circuit $In_{S2}$, the low-speed digital output buffer circuit $Out_{S1}$, and one end of the low-speed analog switch $SW_{S1}$ are coupled to the first low-speed external analog terminal $T_{S1}$ and the other end of the low-speed analog switch $SW_{S1}$ is coupled to the sub-common signal line SUB_COMMON. The low-speed digital input buffer circuit $In_{S2}$, the low-speed digital output buffer circuit $Out_{S2}$, and one end of the low-speed analog switch $SW_{S2}$ are coupled to the second low-speed external analog terminal $T_{S2}$, and the other end of the low-speed analog switch $SW_{S2}$ is coupled to the sub-common signal line SUB_COMMON. In particular, between the first low-speed external analog terminal $T_{S1}$ and the low-speed analog switch $SW_{S1}$, the low-speed separating resistor $r_{S1}$ set to a high resistance value of approximately 1 kΩ is coupled. Similarly, between the second low-speed external analog terminal $T_{S2}$ and the low-speed analog switch $SW_{S2}$, the low-speed separating resistor $r_{S2}$ set to a high resistance value of approximately 1 kΩ is coupled.

Moreover, as shown in FIG. 5, between a digital power line and a digital ground line for supplying the digital power supply voltage Vcc and the digital ground voltage Vss to the low-speed digital input buffer circuit $In_{S1}$, the low-speed digital output buffer circuit $Out_{S1}$, the low-speed digital input buffer circuit $In_{S2}$, and the low-speed digital output buffer circuit $Out_{S2}$, and a digital power line and a digital ground line for supplying the digital power supply voltage Vcc and the digital ground voltage Vss to the high-speed digital input buffer circuits $In_{S1}$, $In_{H2}$, and $In_{HN}$, an inter-power line electrostatic protection circuit ESD_Vcc and an inter-ground line electrostatic protection circuit ESD_Vss are coupled. Each of the protection circuits of the inter-power supply line electrostatic protection circuit ESD_Vcc and the inter-ground line electrostatic protection circuit ESD_Vss comprises two clamp diodes coupled in parallel in directions opposite to each other.

Furthermore, the low-speed analog switches $SW_{S1}$ and $SW_{S2}$ and trunk connection switch $SW_{COM}$ coupled to the sub-common signal line SUB_COMMON and the high-speed analog switches $SW_{H1}$ and $SW_{H2}$ and A/D converter ADC coupled to the common signal line COMMON are formed inside the deep N-type well Deep-N-well having a function to shield from digital noises of the digital circuits formed in the surface of the P-type silicon substrate P-sub. However, actually, as described in FIG. 2, the successive approximation register SAR_Reg, to which the digital power supply voltage Vcc and the digital ground voltage Vss for digital circuits are supplied inside the A/D converter ADC and which generates 16 bit digital signals, is not formed inside the deep N-type well Deep-N-well but is formed in the surface of the P-type silicon substrate P-sub.

Embodiment 2

Another, Specific Configuration of Micro-Controller Unit

FIG. 6 is a view showing another specific configuration according to Embodiment 2 of the present invention of the micro-controller unit MPU illustrated in FIG. 1.

The micro-controller unit MPU according to Embodiment 2 of the present invention illustrated in FIG. 6 differs from the micro-controller unit MPU according to Embodiment 1 of the present invention illustrated in FIG. 5 in the following respects.

That is, in the micro-controller unit MPU according to Embodiment 2 of the present invention illustrated in FIG. 6, to the high-speed digital input buffer circuits $In_{H1}$, $In_{H2}$, and $In_{HN}$ coupled to the high-speed external analog terminals $T_{H1}$, $T_{H2}$, and $T_{HN}$, the digital power supply voltage Vcc and the digital ground voltage Vss for digital circuits are not applied but the analog ground voltage AVss and the analog power supply voltage AVcc for analog circuits are applied.

Accordingly, the devices of the high-speed digital input buffer circuits $In_{H1}$, $In_{H2}$, and $In_{HN}$ near the A/D converter ADC which is an analog circuit can be formed inside the deep N-type well Deep-N-well. This can be done because the devices near the A/D converter ADC do not include the high-speed digital output buffer circuit generating a high level noise. Accordingly, the digital crosstalk noise level from the P-type silicon substrate P-sub induced to the analog input signal wirings (signal wirings of the high-speed analog switches $SW_{H1}$, $SW_{H2}$, ..., and $SW_{HN}$) of the A/D converter ADC, to which the high-speed separating resistors $r_{H1}$, $r_{H2}$, ..., and $r_{HN}$ are coupled, can be reduced.

As described above, a reduction in the noise of the analog input signals supplied from the high-speed external analog terminals $T_{H1}$, $T_{H2}$, and $T_{HN}$ of the micro-controller unit MPU to the analog input terminal of the A/D converter ADC is extremely important. In contrast, since the high-resistance low-speed separating resistors $r_{S1}$ and $r_{S2}$ having a noise reduction effect are coupled to the low-speed external analog terminals $T_{S1}$ and $T_{S2}$, a reduction in the noise of the analog input signal supplied from the low-speed external analog terminals $T_{S1}$ and $T_{S2}$ to the analog input terminal of the A/D converter ADC is relatively not important.

Embodiment 3

<<Another Semiconductor Chip Integrating Analog Circuit Elements and Digital Circuit Elements>>

FIG. 7 is a view showing the structure of an SOI monolithic silicon semiconductor chip according to Embodiment 3 of the present invention having integrated therein the analog circuit elements and digital circuit elements which are incorporated into the micro-controller unit MPU according to Embodiment 1 of the present invention illustrated in FIG. 1.

It should be noted that SOI is the acronym for Silicon On Insulator. The monolithic silicon semiconductor chip of the SOI structure according to Embodiment 3 of the present invention illustrated in FIG. 7 differs from the triple-well monolithic silicon semiconductor chip according to Embodiment 1 of the present invention illustrated in FIG. 3 in the following points.

That is, in the monolithic silicon semiconductor chip of the SOI structure according to Embodiment 3 of the present invention illustrated in FIG. 7, first, the N-type well N-well of a P-channel MOS transistor PMOS and the P-type well P-well of an N-channel MOS transistor NMOS, the P-channel MOS transistor PMOS and the N-channel MOS transistor NMOS being analog circuit elements, are electrically isolated from the lower layer P-type silicon substrate P-sub by a silicon dioxide layer as an intermediate insulating layer. In addition, between the silicon dioxide layer as the intermediate insulating layer and the lower layer P-type silicon substrate P-sub, a deep N-type well Deep-N-well is formed.

Furthermore, in the monolithic silicon semiconductor chip of the SOI structure illustrated in FIG. 7, the N-type well N-well of a P-channel MOS transistor PMOS and the P-type well P-well of an N-channel MOS transistor NMOS, the P-channel MOS transistor PMOS and the N-channel MOS transistor NMOS being digital circuit elements, are electrically isolated from the lower layer P-type silicon substrate P-sub by the silicon dioxide layer as the intermediate insulating layer. Moreover, between the silicon dioxide layer as the intermediate insulating layer and the lower layer P-type silicon substrate P-sub, the deep N-type well Deep-N-well and a deep P-type well Deep-P-well are formed.

As a result, according to the monolithic silicon semiconductor chip of the SOI structure illustrated in FIG. 7, such an effect can be obtained that the noise generated from the P-channel MOS transistor PMOS and the N-channel MOS transistor NMOS which are digital circuit elements does not substantially transmit to the P-channel MOS transistor PMOS and the N-channel MOS transistor NMOS which are analog circuit elements, the A/D converter, and other analog circuits via the P-type silicon substrate P-sub.

Embodiment 4

FIG. 8 is a diagram showing the configuration of a semiconductor integrated circuit as the micro-controller unit MPU according to Embodiment 4 of the present invention.

As shown in FIG. 8, an analog circuit core 10 of a semiconductor chip IC_Chip of a semiconductor integrated circuit includes an analog multiplexer (MPX) 11 and a successive approximation type A/D converter (SAR_ADC) 12.

<<Analog Circuit Core>>

The analog multiplexer (MPX) 11 illustrated in FIG. 8 comprises the high-speed analog switches $SW_{H1}$, $SW_{H2}$, ..., and $SW_{HN}$ and the low-speed analog switches $SW_{S1}$ and $SW_{S2}$ included in the micro-controller unit MPU according to Embodiment 1 of the present invention illustrated in FIG. 5 or Embodiment 2 of the present invention illustrated in FIG. 6. It should be noted that the analog multiplexer (MPX) 11 illustrated in FIG. 8 includes the common signal line COMMON, trunk connection switch $SW_{COM}$, and sub-common signal line SUB_COMMON included in the micro-controller unit MPU according to Embodiment 1 of the present invention illustrated in FIG. 5 or Embodiment 2 of the present invention illustrated in FIG. 6.

Eight channel analog input terminals AN0, AN1, ..., and AN7 of the analog multiplexer (MPX) 11 illustrated in FIG. 8 comprise the high-speed external analog terminals $T_{H1}$, $T_{H2}$, ..., and $T_{HN}$ and low-speed external analog terminals $T_{S1}$ and $T_{S2}$ included in the micro-controller unit MPU according to Embodiment 1 of the present invention of FIG. 5 or Embodiment 2 of the present invention of FIG. 6.

The successive approximation type A/D converter (SAR_ADC) 12 illustrated in FIG. 8 can comprise the successive approximation type analog-to-digital converter according to Embodiment 1 of the present invention illustrated in FIG. 2. It should be noted that, the analog power supply voltage AVcc set to a relatively high voltage, e.g., 5 v, is supplied to the analog circuit core 10 while the analog ground voltage AVss is supplied to the analog circuit core 10.

<<Digital Circuit Core>>

As shown in FIG. 8, a digital circuit core 20 of the semiconductor chip IC_Chip of the semiconductor integrated circuit includes a central processing unit (CPU) 21, a random access memory (RAM) 22, a flash nonvolatile memory device (NV_Flash) 23, a read only memory (ROM) 24, and a bus switch controller (BSC) 25. It should be noted that the digital power supply voltage Vcc set to a relatively low voltage, e.g., approximately 1 V, is supplied to the digital circuit core 20 while the digital ground voltage Vss is supplied to the digital circuit core 20.

That is, the random access memory (RAM) 22, the flash nonvolatile memory device (NV_Flash) 23, the read only memory (ROM) 24, and the bus switch controller (BSC) 25 are coupled to the central processing unit (CPU) 21 via a CPU bus CPU_Bus and control lines Cntr_Lines. It should be noted that a plurality of peripheral circuits Periph_Cir1 and Periph_Cir2 is coupled to the central processing unit (CPU) 21 via the CPU bus CPU_Bus, the control line Cntr_Lines, peripheral-bus Periph_Bus, and a bus switch controller (BSC) 25.

Accordingly, the input analog signal which is selected and sampled by the analog multiplexer (MPX) 11 is converted to a digital signal by the successive approximation type A/D converter (SAR_ADC) 12 of the analog circuit core 10, and the converted digital signal can be processed by the central processing unit (CPU) 21 via the peripheral-bus Periph_Bus, the bus switch controller (BSC) 25, and the CPU bus CPU_Bus.

It should be noted that, although not illustrated in FIG. 8, the digital input signals from the output terminals of the high-speed digital input buffer circuits $In_{H1}$, $In_{H2}$, and $In_{HN}$ coupled to the high-speed external analog terminals $T_{H1}$, $T_{H2}, \ldots$, and $T_{HN}$ combined with the digital terminals are supplied to the central processing unit (CPU) 21 via the CPU bus CPU_Bus. Furthermore, the digital input signals from the output terminals of the low-speed digital input buffer circuits $In_{S1}$ and $In_{S2}$ coupled to the low-speed external analog terminals $T_{S1}$ and $T_{S2}$ combined with the digital terminals are supplied to the central processing unit (CPU) 21 via the CPU bus CPU_Bus. Furthermore, to the input terminals of the low-speed digital output buffer circuits $Out_{S1}$ and $Out_{S2}$ coupled to the low-speed external analog terminals $T_{S1}$ and $T_{S2}$ combined with the digital terminals, the digital output signal generated from the central processing unit (CPU) 21 is supplied via the CPU bus CPU_Bus.

As described above, although the invention made by the present inventor has been described specifically based on the various embodiments, it is apparent that the present invention is not limited thereto and various modifications may be made without departing from the scope of the invention.

It is needless to say, for example, that the present invention is not limited to the semiconductor integrated circuits, such as a general-purpose microcomputer or microcontroller incorporating an A/D converter, and can be applicable to application specific system-on-chips (SOC).

What is claimed is:

1. A semiconductor integrated circuit comprising a plurality of high-speed external terminals, a plurality of low-speed external terminals, a plurality of high-speed analog switches, a plurality of low-speed analog switches, and an A/D converter, wherein
    each terminal of the high-speed external terminals is connectable to an input terminal of the A/D converter via each switch of the high-speed analog switches, wherein
    each terminal of the low-speed external terminals is connectable to the input terminal of the A/D converter via each switch of the low-speed analog switches, wherein
    a plurality of input terminals of a plurality of low-speed digital input buffer circuits and a plurality of output terminals of a plurality of low-speed digital output buffer circuits are coupled to the low-speed external terminals, respectively, wherein
    a plurality of output terminals of any digital output buffer circuit is not coupled, but a plurality of input terminals of a plurality of high-speed digital input buffer circuits is coupled to the high-speed external terminals, and wherein
    between each of the terminals of the low-speed external terminals and each of the switches of the low-speed analog switches, a low-speed separating resistor set to resistance value higher than a resistance value between each of the terminals of the high-speed external terminals and each of the switches of the high-speed analog switches is coupled.

2. The semiconductor integrated circuit according to claim 1, further comprising a common signal line, a trunk connection switch, and a sub-common signal line, wherein
    the common signal line is coupled to the input terminal of the A/D converter, wherein
    the sub-common signal line is connectable to the common signal line and the input terminal of the A/D converter via the trunk connecting switch, wherein
    each of the terminals of the high-speed external terminals is coupled to the common signal line via each of the switches of the high-speed analog switches, and wherein
    each of the terminals of the low-speed external terminals is coupled to the sub-common signal line via each of the switches of the low-speed analog switches.

3. The semiconductor integrated circuit according to claim 2, wherein
    each of the switches of the low-speed analog switches comprises a low-speed CMOS analog switch with a predetermined on-resistance and a predetermined element size, and wherein
    each of the switches of the high-speed analog switches has an on-resistance smaller than the predetermined on-resistance of the low-speed CMOS analog switch, and comprises a high-speed CMOS analog switch having an element size larger than the predetermined element size of the low-speed CMOS analog switch.

4. The semiconductor integrated circuit according to claim 3, wherein between each of the terminals of the high-speed external terminals and each of the switches of the high-speed analog switches, a high-speed separating resistor set to a resistance value lower than a resistance value of the low-speed separating resistor is coupled.

5. The semiconductor integrated circuit according to claim 4, wherein the trunk connecting switch comprises a trunk connection CMOS analog switch with a predetermined on-resistance and a predetermined element size.

6. The semiconductor integrated circuit according to claim 5, wherein a plurality of low-speed electrostatic protection circuits is coupled to the low-speed external terminals and a plurality of high-speed electrostatic protection circuits is coupled to the high-speed external terminals.

7. The semiconductor integrated circuit according to claim 6, further comprising a digital circuit to which a digital power supply voltage and a digital ground voltage are supplied, wherein
    an analog power supply voltage and an analog ground voltage are supplied to the A/D converter, the low-speed CMOS analog switch, the high-speed CMOS analog switch, and the trunk connection CMOS analog switch.

8. The semiconductor integrated circuit according to claim 7, wherein the digital power supply voltage and the digital ground voltage are supplied to the low-speed digital input buffer circuits, the low-speed digital output buffer circuits, and the high-speed digital input buffer circuits.

9. The semiconductor integrated circuit according to claim 8, wherein
the A/D converter, the low-speed CMOS analog switch, the high-speed CMOS analog switch, and the trunk connection CMOS analog switch are formed in an analog element forming region of the semiconductor integrated circuit, and wherein
the digital circuit, the low-speed digital input buffer circuits, the low-speed digital output buffer circuits, and the high-speed digital input buffer circuits are formed in a digital element forming region of the semiconductor integrated circuit.

10. The semiconductor integrated circuit according to claim 9, wherein the digital element forming region and the analog element forming region are electrically isolated from each other inside the semiconductor integrated circuit.

11. The semiconductor integrated circuit according to claim 10, wherein
the digital element forming region is formed by a P-type silicon substrate of the semiconductor integrated circuit of a triple-well structure, and wherein
the analog element forming region is formed by a deep N-type well formed inside the P-type silicon substrate.

12. The semiconductor integrated circuit according to claim 10, wherein
in the semiconductor integrated circuit of an SOI structure, an analog region and a digital region electrically isolated from each other are formed in an upper silicon layer formed in the upper portion of a silicon dioxide layer as an intermediate insulating layer of the SOI structure, and wherein
the analog region and the digital region are used as the analog element forming region and the digital element forming region, respectively.

13. The semiconductor integrated circuit according to claim 7, wherein
the digital power supply voltage and the digital ground voltage are supplied to the low-speed digital input buffer circuits and the low-speed digital output buffer circuits, and wherein
the analog power supply voltage and the analog ground voltage are supplied to the high-speed digital input buffer circuits.

14. The semiconductor integrated circuit according to claim 13, wherein
the A/D converter, the low-speed CMOS analog switch, the high-speed CMOS analog switch, the trunk connection CMOS analog switch, and the high-speed digital input buffer circuits are formed in an analog element forming region of the semiconductor integrated circuit, and wherein
the digital circuit, the low-speed digital input buffer circuits, and the low-speed digital output buffer circuits are formed in a digital element forming region of the semiconductor integrated circuit.

15. The semiconductor integrated circuit according to claim 14, wherein the digital element forming region and the analog element forming region are electrically isolated from each other inside the semiconductor integrated circuit.

16. The semiconductor integrated circuit according to claim 15, wherein
the digital element forming region is formed by a P-type silicon substrate of the semiconductor integrated circuit of a triple-well structure, and wherein
the analog element forming region is formed by a deep N-type well formed inside the P-type silicon substrate.

17. The semiconductor integrated circuit according to claim 15, wherein
in the semiconductor integrated circuit of an SOI structure, an analog region and a digital region electrically isolated from each other are formed in an upper silicon layer formed in the upper portion of a silicon dioxide layer as an intermediate insulating layer of the SOI structure, and wherein
the analog region and the digital region are used as the analog element forming region and the digital element forming region, respectively.

18. The semiconductor integrated circuit according to claim 7, wherein the A/D converter comprises a successive approximation type analog-to-digital converter including a comparator, a successive approximation register, and a local D-A converter.

19. The semiconductor integrated circuit according to claim 18, wherein the digital circuit includes a central processing unit.

20. The semiconductor integrated circuit according to claim 18, wherein
a plurality of high-speed digital input signals from the output terminals of the high-speed digital input buffer circuits is supplied to the digital circuit, wherein
a plurality of digital input signals from the output terminals of the low-speed digital input buffer circuits is supplied to the digital circuit, and wherein
a plurality of digital output signals generated from the digital circuit is supplied to a plurality of input terminals of the low-speed digital output buffer circuits.

* * * * *